(12) United States Patent
Luo et al.

(10) Patent No.: US 12,513,841 B2
(45) Date of Patent: Dec. 30, 2025

(54) ELECTRICAL LEAD-OUT STRUCTURE AND PREPARATION METHOD THEREOF, HERMETIC APPARATUS, AND OPTICAL COMMUNICATION DEVICE

(71) Applicant: HUAWEI TECHNOLOGIES CO., LTD., Guangdong (CN)

(72) Inventors: Jun Luo, Wuhan (CN); Zengguang Guo, Wuhan (CN); Xiaokang Xiao, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 182 days.

(21) Appl. No.: 18/416,937

(22) Filed: Jan. 19, 2024

(65) Prior Publication Data
US 2024/0164040 A1 May 16, 2024

Related U.S. Application Data

(63) Continuation of application No. PCT/CN2022/106283, filed on Jul. 18, 2022.

(30) Foreign Application Priority Data

Jul. 20, 2021 (CN) .......................... 202110819312.5

(51) Int. Cl.
*H05K 1/02* (2006.01)
*G02B 6/42* (2006.01)
*H05K 3/28* (2006.01)
*H05K 5/06* (2006.01)

(52) U.S. Cl.
CPC ........... *H05K 5/069* (2013.01); *G02B 6/4248* (2013.01); *H05K 1/028* (2013.01); *H05K 3/284* (2013.01)

(58) Field of Classification Search
CPC ................. H05K 1/0281; H05K 1/189; H05K 2201/2009
See application file for complete search history.

(56) References Cited

U.S. PATENT DOCUMENTS 9,428,322 B2    8/2016   Moffat et al.
2003/0001250 A1*   1/2003   Chien-Hung .......... H04N 23/54
                                                                    257/684

FOREIGN PATENT DOCUMENTS

CN    104459907 A    3/2015
CN    112838423 A    5/2021

OTHER PUBLICATIONS

International Search Report and Written Opinion issued in PCT Application No. PCT/CN2022/106283 dated Sep. 23, 2022.

* cited by examiner

*Primary Examiner* — Sherman Ng

(57) ABSTRACT

An electrical lead-out structure is used for hermetic package. The electrical lead-out structure includes a flexible circuit board and a packaging layer. The flexible circuit board includes an electrical signal layer and a reinforcing layer that are stacked up. The reinforcing layer is provided with a window that passes through the reinforcing layer. The electrical signal layer is adjacent to the window. The packaging layer fills the window, and a side that is of the packaging layer and that faces the electrical signal layer is insulatingly adjacent to the electrical signal layer. The packaging layer is disposed on the flexible circuit board, so that in the electrical lead-out structure, a feed-through area used for soldering to a hermetic housing is formed.

17 Claims, 4 Drawing Sheets

ELECTRICAL LEAD-OUT STRUCTURE AND PREPARATION METHOD THEREOF, HERMETIC APPARATUS, AND OPTICAL COMMUNICATION DEVICE

CROSS-REFERENCE TO RELATED APPLICATIONS

This application is a continuation of International Application No. PCT/CN2022/106283, filed on Jul. 18, 2022, which claims priority to Chinese Patent Application No. 202110819312.5, filed on Jul. 20, 2021. The disclosures of the aforementioned applications are hereby incorporated by reference in their entireties.

TECHNICAL FIELD

This application relates to the field of optical communication technologies, and in particular, to an electrical lead-out structure and a preparation method thereof, a hermetic apparatus, and an optical communication device.

BACKGROUND

A package being hermetic means that a sealed chamber made of a hermetic and waterproof material isolates an electronic component from a surrounding environment. A hermetic apparatus is an apparatus that is packaged through the hermetic package. During sealing of the hermetic package, water vapor of a self-packaged chamber is eliminated, and entry of surrounding moisture is prevented, so that the hermetic package can achieve good long-term reliability. In some hermetic apparatuses that have high requirements for packaging hermeticity, a functional component inside the hermetic apparatus needs to be electrically connected to a circuit structure outside the hermetic apparatus through an electrical lead-out structure. In the electrical lead-out structure, interconnection is usually performed between a flexible circuit board and at least two electrical connectors that are connected to the flexible circuit board. However, there typically are a large quantity of electrical connectors used for interconnection. This undoubtedly complicates the electrical lead-out structure, increases occupied space of the hermetic apparatus, and is not conducive to miniaturization development of the hermetic apparatus.

SUMMARY

Embodiments of this application provide an electrical lead-out structure whose structure is simplified and occupied space is reduced and a preparation method thereof, a hermetic apparatus, and an optical communication device.

According to a first aspect, this application provides an electrical lead-out structure that is used for hermetic package. The electrical lead-out structure includes a flexible circuit board and a packaging layer, the flexible circuit board includes an electrical signal layer and a reinforcing layer, the electrical signal layer and the reinforcing layer are stacked up, the reinforcing layer is provided with a window that passes through the reinforcing layer, the electrical signal layer is adjacent to the window, the packaging layer fills the window, and a side that is of the packaging layer and that faces the electrical signal layer is insulatingly adjacent to the electrical signal layer.

In the example electrical lead-out structure provided in this application, the packaging layer is configured to be soldered to a hermetic housing, to implement a hermetic connection between the electrical lead-out structure and the hermetic housing. The packaging layer is disposed on a flexible circuit board, so that in the electrical lead-out structure, a feed-through area used for soldering to the hermetic housing is formed. "Through-wall" hermeticity is directly implemented by using the feed-through area. In other words, in the electrical lead-out structure, structures soldered to the hermetic housing are integrated together. In this way, a plurality of interconnection times performed through a pin receptacle are not required, and the electrical lead-out structure can perform electrical lead-out without a specially bent layout, to simplify a structure of the electrical lead-out structure and reduce an occupied space of the electrical lead-out structure.

With reference to the first aspect, in a first possible implementation of the first aspect of this application, the packaging layer includes a glass substrate layer and a metal layer that are stacked up, the glass substrate layer fills the window and is insulatingly adjacent to the electrical signal layer, and the metal layer is disposed on a side that is of the glass substrate layer and that is away from the electrical signal layer. The glass substrate layer is configured to be soldered to a metal element to form a whole, which is called a hermetic seal. The metal layer can improve wettability of a solder, and the metal layer can form an intermetallic compound with the solder during soldering of the packaging layer, to improve soldering reliability.

With reference to the first aspect or the first possible implementation of the first aspect of this application, in a second possible implementation of the first aspect of this application, the glass substrate layer includes a first connecting portion and a second connecting portion, the first connecting portion is accommodated in the window, the second connecting portion covers a side that is of the first connecting portion and that is away from the electrical signal layer, two end portions of the second connecting portion in an extension direction of the flexible circuit board always cover a side that is of the reinforcing layer and that is away from the electrical signal layer, and the second connecting portion covers the side that is of the reinforcing layer and that is away from the electrical signal layer. In other words, the second connecting portion is located outside the window, and a length of the second connecting portion in an extension direction of the electrical lead-out structure is greater than a length of the window, to prevent the electrical signal layer from being damaged due to insufficient strength caused by suspension during the soldering.

With reference to the first aspect or the first or second possible implementation of the first aspect of this application, in a third possible implementation of the first aspect of this application, the electrical signal layer includes a first surface and a second surface that are disposed opposite to each other, there are two reinforcing layers, one of the reinforcing layers covers the first surface, the other of the reinforcing layers covers the second surface, and each of the two reinforcing layers is provided with the window, so that hermetic connections can be performed on both of the two opposite surfaces of the flexible circuit board.

With reference to the first aspect or the first to the third possible implementations of the first aspect of this application, in a fourth possible implementation of the first aspect of this application, a position of each window at one reinforcing layer corresponds to a position of one window at the other reinforcing layer, the windows at the two reinforcing layers are arranged in alignment in a stacking direction of the electrical signal layer and the reinforcing layer for soldering.

With reference to the first aspect or the first to the fourth possible implementations of the first aspect of this application, in a fifth possible implementation of the first aspect of this application, the metal layer includes gold or silver.

With reference to the first aspect or the first to fifth possible implementations of the first aspect of this application, in a sixth possible implementation of the first aspect of this application, a melting point of the glass substrate layer is lower than a melting point of the reinforcing layer, and the melting point of the reinforcing layer is lower than a melting point of the electrical signal layer.

With reference to the first aspect or the first to the sixth possible implementations of the first aspect of this application, in a seventh possible implementation of the first aspect of this application, the electrical lead-out structure further includes an electrical connector, the electrical signal layer at a first end of the flexible circuit board is configured to electrically connect to a functional component, and the electrical connector is fastened to and electrically connected to a second end of the flexible circuit board. The electrical connector is configured to be disposed outside the hermetic housing to connect to a circuit structure outside the hermetic housing, to facilitate plugging and unplugging of the external circuit structure.

According to a second aspect, this application provides a hermetic apparatus. The hermetic apparatus includes a hermetic housing, a functional component, and the electrical lead-out structure according to the first to the sixth possible implementations of the first aspect. The hermetic housing is provided with a connecting hole that passes through a side wall of the hermetic housing, the functional component is accommodated in the hermetic housing, the electrical lead-out structure passes through the connecting hole, a side that is of a packaging layer and that is away from an electrical signal layer is soldered to the hermetic housing, the electrical signal layer at a first end of a flexible circuit board is electrically connected to the functional component, and a second end of the flexible circuit board is exposed outside the hermetic housing.

With reference to the second aspect, in a first possible implementation of the second aspect of this application, the hermetic apparatus is a wavelength selective switch, and the functional component is configured to perform optical path conversion.

With reference to the second aspect or the first possible implementation of the second aspect of this application, in a second possible implementation of the second aspect of this application, the electrical lead-out structure further includes an electrical connector, and the electrical connector is fixedly connected to the second end of the flexible circuit board and is electrically connected to the electrical signal layer at the second end of the flexible circuit board.

According to a third aspect, this application provides a method for preparing an electrical lead-out structure. The method includes the following steps: providing a flexible circuit board, where the flexible circuit board includes an electrical signal layer and a reinforcing layer covering the electrical signal layer; forming, at the reinforcing layer, a window that passes through the reinforcing layer; and filling a packaging layer in the window, where a side that is of the packaging layer and that faces the electrical signal layer is insulatingly adjacent to the electrical signal layer, and a side that is of the packaging layer and that is away from the electrical signal layer is configured to be soldered to a metal connecting element.

With reference to the third aspect, in a first implementation of the third aspect of this application, before the filling a packaging layer in the window, the preparation method further includes: forming a metal layer on one side of a glass substrate layer to form the packaging layer. The filling a packaging layer in the window includes: enabling the electrical signal layer to be insulatingly adjacent to a side that is of the glass substrate layer and that is away from the metal layer. The metal layer is configured to form an intermetallic compound with a solder during soldering of the packaging layer.

With reference to the third aspect or the first implementation of the third aspect of this application, in a second implementation of the third aspect of this application, the filling a packaging layer in the window includes: hermetically connecting the packaging layer to the electrical signal layer at the window through hot pressing.

According to a fourth aspect, this application provides an optical communication device. The optical communication device includes the hermetic apparatus provided in the second aspect and a drive board. The hermetic apparatus is a wavelength selective switch, and a second end that is of a flexible circuit board and that is exposed outside a hermetic housing is electrically connected to the drive board through an electrical connector.

DESCRIPTION OF EMBODIMENTS

Figure 1:
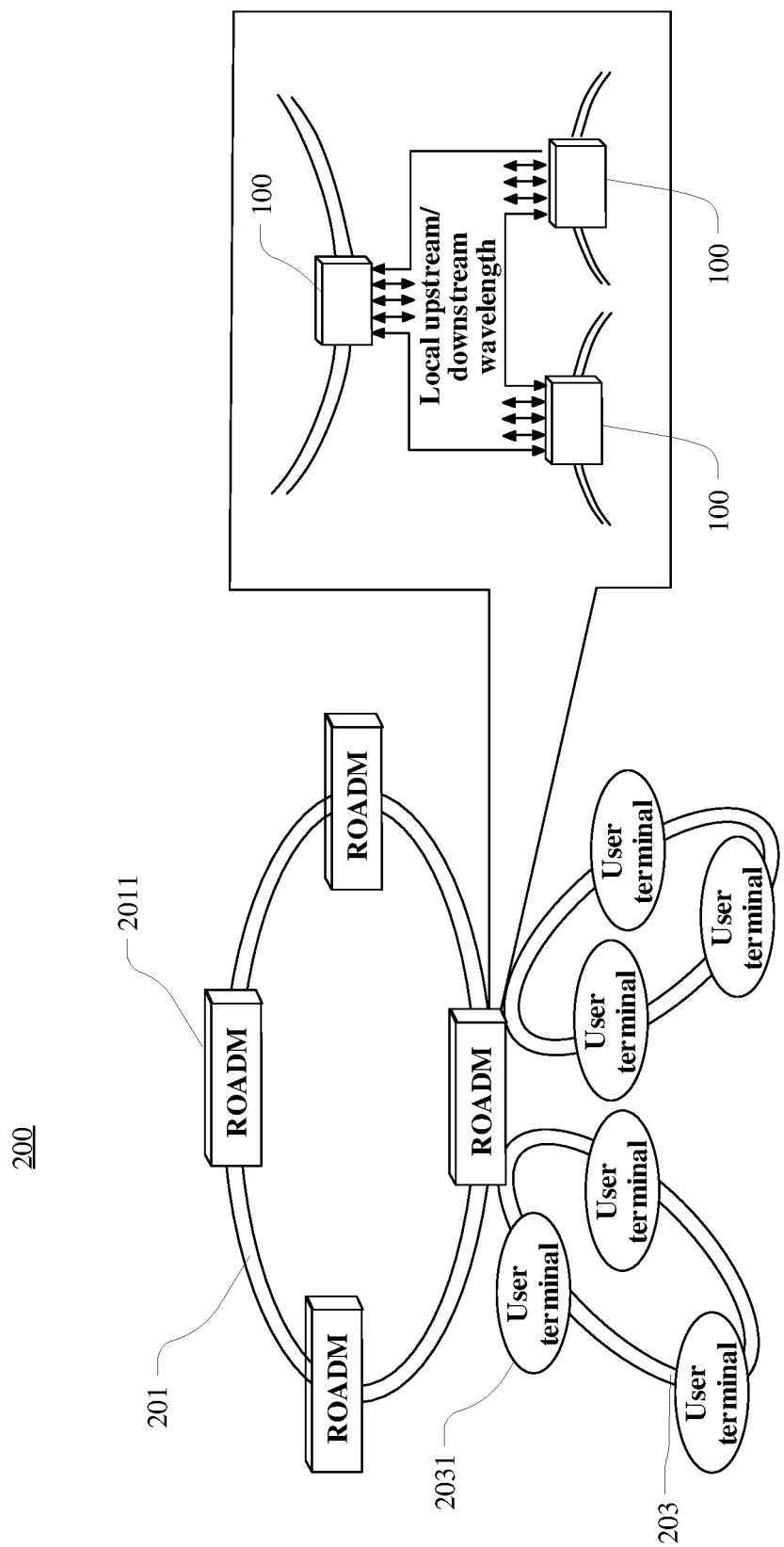
FIG. 1 is a schematic diagram of an all-optical network system according to an implementation of this application.

In some hermetic apparatuses that have high requirements for packaging hermeticity, a functional component inside the hermetic apparatus needs to be electrically connected to a circuit structure outside the hermetic apparatus through an electrical lead-out structure. A wavelength selective switch is used as an example. The wavelength selective switch (WSS) is a free space optical system with a long optical path. In the optical system, a light beam is diverted by reflection, refraction, and diffraction. A propagation direction of the light beam is very sensitive to an environmental refractive index (for example, a refractive index of a gas medium between optical elements) of the optical system. A change in a refractive index of a gas medium causes a change in the propagation direction of the light beam. As a result, optical performance of the wavelength selective switch is affected. Temperature, pressure, water vapor content, and external pollution all affect a refractive index of a medium. Therefore, the wavelength selective switch has a very high requirement for packaging hermeticity, to ensure the optical performance of the wavelength selective switch.

Some functional components in the wavelength selective switch need to pass through a hermetic housing ("pass through a wall") through an electrical lead-out structure, to electrically connect to a drive board or another external circuit structure outside the wavelength selective switch. The electrical lead-out structure needs to be soldered to the hermetic housing to achieve hermeticity. An outermost material of a flexible circuit board is usually polyimide (PI for short). The polyimide is an organic molecular material, and cannot be soldered to the hermetic housing using a solder to achieve hermeticity. Therefore, the existing flexible circuit board cannot be independently used as the electrical lead-out structure to pass through the hermetic housing.

In a related electrical lead-out solution, electrical lead-out is implemented in a manner in which interconnection is performed among a flexible circuit board, an electrical connector pair, and a flexible circuit board. The electrical connector pair includes a first electrical connector, an electrical connecting element, and a second electrical connector. The first electrical connector and the second electrical connector are pin receptacles, the electrical connecting element is provided with pins matching the pin receptacles, a component in an apparatus is electrically connected to the first electrical connector through a first flexible circuit board, the electrical connecting element is soldered to a hermetic housing of the apparatus, and the second electrical connector is electrically connected to a module or a device outside the apparatus through a second flexible circuit board. However, in the electrical lead-out solution, a large quantity of components are required. As a result, a structure is complex and large space is occupied. In addition, the first electrical connector and the second electrical connector need to be used for interconnection and to be plugged or unplugged, and the first flexible circuit board or the second flexible circuit board may need to be folded additionally. Consequently, assembly efficiency of a wavelength selective switch is affected.

Based on this, this application provides an electrical lead-out structure and a hermetic apparatus related to the electrical lead-out structure. The electrical lead-out structure includes a flexible circuit board and a packaging layer. The flexible circuit board includes an electrical signal layer and a reinforcing layer that are stacked up, the reinforcing layer is provided with a window that passes through the reinforcing layer, the electrical signal layer is adjacent to the window, the packaging layer fills the window, and a side that is of the packaging layer and that faces the electrical signal layer is insulatingly adjacent to the electrical signal layer.

The hermetic apparatus includes a hermetic housing, a functional component, and the foregoing electrical lead-out structure. The hermetic housing is provided with a connecting hole that passes through a side wall of the hermetic housing, the functional component is accommodated in the hermetic housing, the electrical lead-out structure passes through the connecting hole, a side that is of the packaging layer and that is away from the electrical signal layer is soldered to the hermetic housing, the functional component is accommodated in the hermetic housing, the electrical signal layer at a first end of the flexible circuit board in an extension direction of the flexible circuit board is electrically connected to the functional component, and a second end of the flexible circuit board in the extension direction of the flexible circuit board is exposed outside the hermetic housing and is configured to be electrically connected to an apparatus or a device located outside the hermetic housing.

The hermetic apparatus may be an optical component that has a high requirement for packaging hermeticity, for example, a wavelength selective switch or an optical module. The functional component may be an optical component that can perform optical path conversion.

The following implementations further describe the electrical lead-out structure and a preparation method thereof, and the related hermetic apparatus by using an example in which the hermetic apparatus is a wavelength selective switch.

With reference to FIG. 1, an implementation of this application provides an all-optical network (AON) system 200, including a backbone network ring 201 and an access network ring 203. The backbone network ring 201 includes a plurality of optical switching nodes 2011 (which may also be referred to as all-optical nodes). The all-optical network system 200 is a system based on a dense wavelength division multiplexing technology. The optical switching node 2011 uses a reconfigurable optical add-drop multiplexer (reconfigurable optical add-drop multiplexer, ROADM), which can dynamically configure an upstream or downstream service wavelength according to a requirement, to implement flexible service grooming. The access network ring 203 includes a plurality of user terminals 2031. The access network ring 203 performs an upstream/downstream wavelength service with the backbone network ring 201 through the optical switching node 2011. The upstream/downstream wavelength service means that the access network ring 203 transmits an optical signal to the backbone network ring 201 through the optical switching node 2011, and the backbone network ring 201 transmits an optical signal to the access network ring 203 through the optical switching node 2011. The access network ring 203 refers to all devices between the backbone network ring 201 and the user terminal 2031. The user terminal 2031 may be a device that provides a voice and/or data connection to a user, or may be connected to a computing device, for example, a laptop computer or a desktop computer, or may be an independent device, for example, a personal digital assistant (PDA).

Figure 2:
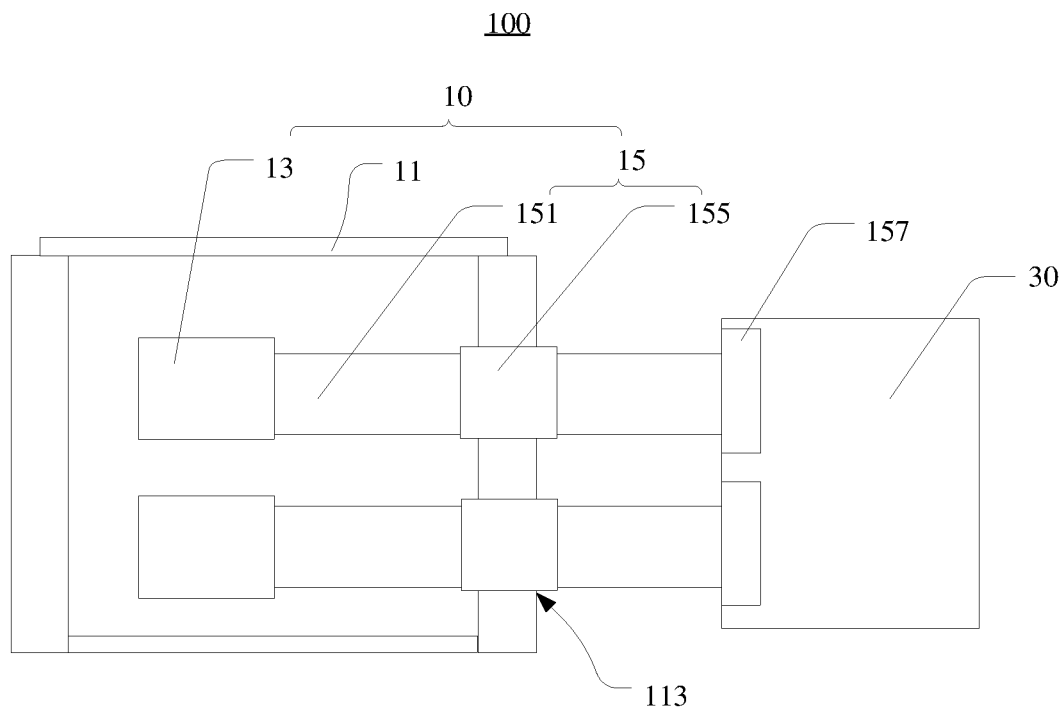
FIG. 2 is a schematic diagram of a wavelength selective switch assembly according to an implementation of this application.
Figure 3:
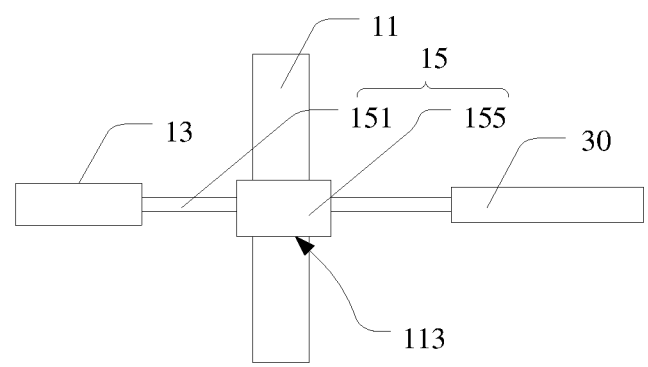
FIG. 3 is a side view of a wavelength selective switch assembly according to an implementation of this application.

The optical switching node 2011 using the ROADM includes a plurality of optical communication devices 100. With reference to FIG. 2 and FIG. 3, an optical communication device 100 includes a wavelength selective switch 10 and a drive board 30 electrically connected to the wavelength selective switch 10. The wavelength selective switch 10 can implement any interconnection of optical signals between an access network ring 203 and a backbone network ring 201, and can dynamically adjust an upstream/downstream wavelength of each optical switching node 2011 in an all-optical network 200, to implement wavelength resource allocation between the optical switching nodes 2011 in the all-optical network 200. It may be understood that the optical switching node 2011 using an ROADM may further include other modules such as a fiber amplifier, a multicast switch (MCS), and an arrayed waveguide grating. Details are not described herein.

The wavelength selective switch 10 uses a hermetic package. The hermetic package means that a hermetic housing made of a hermetic and waterproof material isolates components (for example, an electronic component and an optical component) from a surrounding environment.

The wavelength selective switch 10 includes a hermetic housing 11, a functional component 13, and an electrical lead-out structure 15. In this implementation, the hermetic housing 11 uses a kovar (kovar) alloy material. The kovar alloy has a linear expansion coefficient similar to that of silicon-boron hard glass between 20° C. and 450° C., has a high Curie point, and has good low-temperature structure stability. The hermetic housing 11 is provided with a connecting hole 113 that passes through a side wall of the hermetic housing 11.

It may be understood that, in some implementations, the hermetic housing 11 is not limited to a metal housing in this application. For example, a local area of the hermetic housing 11 may be made of metal, the hermetic housing 11 may be provided with a connecting hole 113 that passes through the local area made of metal, and the local area of the hermetic housing 11 made of metal is soldered to the electrical lead-out structure 15. The hermetic housing 11 is not limited to the kovar alloy, and may also use another appropriate material.

It may be understood that, the wavelength selective switch 10 further includes other structure that may be necessary for operation or optional for operation. For example, the hermetic housing 11 is provided with an optical fiber inlet and outlet opening. Details are not described herein.

The functional component 13 is accommodated in the hermetic housing 11, and the functional component 13 is configured to perform optical path conversion. The electrical lead-out structure 15 passes through the connecting hole 113 and is soldered to the hermetic housing 11, to implement hermeticity. A first end of the electrical lead-out structure 15 is electrically connected to the functional component 13, and a second end of the electrical lead-out structure 15 is electrically connected to the drive board 30, so that the functional component 13 is electrically connected to the drive board 30. The functional component 13 includes a liquid crystal on silicon, a micro-electro-mechanical system, and the like.

Figure 4:
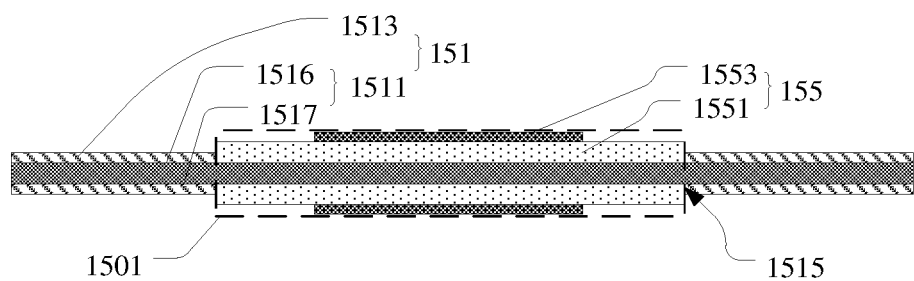
FIG. 4 is a schematic diagram of a structure of an electrical lead-out structure according to an implementation of this application.

With reference to FIG. 4, an electrical lead-out structure 15 includes a flexible circuit board 151 and a packaging layer 155. The flexible circuit board 151 includes an electrical signal layer 1511 and a reinforcing layer 1513 that are stacked up. The electrical signal layer 1511 is configured to dispose a wire for transmission of an electrical signal. It may be understood that a structure of the electrical signal layer 1511 is not limited in this application. For example, the electrical signal layer 1511 may include a substrate, a copper foil, and an adhesive layer, where the adhesive layer adheres between the substrate and the copper foil. It may be understood that the electrical lead-out structure 15 is not limited to being used for a wavelength selective switch 10, and may alternatively be used for another hermetic apparatus. It may be understood that the electrical lead-out structure 15 may not be used for the hermetic apparatus, and a functional component 13 may not have an optical path conversion function.

The reinforcing layer 1513 covers the electrical signal layer 1511, and is configured to protect the electrical signal layer 1511 and reinforce strength of the electrical lead-out structure 15. In this implementation, the reinforcing layer 1513 is made of polyimide (PI). The reinforcing layer 1513 is an outermost layer of the flexible circuit board 151. The reinforcing layer 1513 is provided with a window 1515 that passes through the reinforcing layer 1513. In this way, the electrical signal 1511 can be adjacent to the window 1515. In this implementation, the electrical signal layer 1511 includes a first surface 1516 and a second surface 1517 that are disposed opposite to each other, and there are two reinforcing layers 1513. One reinforcing layer 1513 covers the first surface 1516, and the other reinforcing layer 1513 covers the second surface 1517. Each of the two reinforcing layers 1513 is provided with the window 153. Each window 1515 of one reinforcing layer 1513 corresponds to one window 1515 of the other reinforcing layer 1513. The windows 1515 of the two reinforcing layers 1513 are arranged in alignment in a stacking direction of the reinforcing layer 1513 and the electrical signal layer 1511. It may be understood that, in some implementations, there may be one reinforcing layer 1513. For example, one reinforcing layer 1513 covers the electrical signal layer 1511.

The packaging layer 155 fills the window 1515. A side that is of the packaging layer 155 and that faces the electrical signal layer 1511 is insulatingly adjacent to the electrical signal layer 1511. The packaging layer 155 is configured to be soldered to a hermetic housing 11 when the electrical lead-out structure 15 passes through a connecting hole 113, to implement a hermetic connection between the electrical lead-out structure 15 and the hermetic housing 11. The packaging layer 155 is disposed in the electrical lead-out structure 15 to form a feed-through area 1501 used for soldering to the hermetic housing 11, and a "through-wall" is directly implemented by using the feed-through area 1501. In other words, in the electrical lead-out structure 15, structures soldered to the hermetic housing 11 are integrated together. In this way, a plurality of interconnection times performed through a pin receptacle are not required, and the electrical lead-out structure 15 can perform electrical lead-out without a specially bent layout, to simplify a structure of the wavelength selective switch 10, and improve assembly efficiency of the wavelength selective switch 10.

The packaging layer 155 includes a glass substrate layer 1551 and a metal layer 1553 that are stacked up. The glass substrate layer 1551 is accommodated in the window 1515 and is insulatingly adjacent to the electrical signal layer 1511. The glass substrate layer 1551 is soldered to the hermetic housing 11. The metal layer 1553 covers a side that is of the glass substrate layer 1551 and that is away from the electrical signal layer 1511. The metal layer 1551 is configured to improve wettability of solder. When the glass substrate layer 1551 is soldered to the hermetic housing 11, the metal layer 1551 can form an intermetallic compound (IMC) with the solder, to implement hermeticity and improve stability of a connection between the packaging layer 155 and the hermetic housing 11. In this implementation, the metal layer 1553 is made of a material of gold (Au), and the gold can improve the wettability of the solder. The solder may be a low-temperature SnBi solder, but is not so limited. It may be understood that a material of the metal layer 1553 is not limited to Au, and the metal layer 1553 may use another metal material, for example, Ag. If the metal layer 1553 is too thin, the metal layer 1553 is easily diffused during the soldering, and the glass substrate layer 1553 is exposed. If the metal layer 1553 is too thick, the soldering may be affected. A thickness of the metal layer 1553 may be but is not limited to 5 to 10 micrometers (μm).

Figure 5:
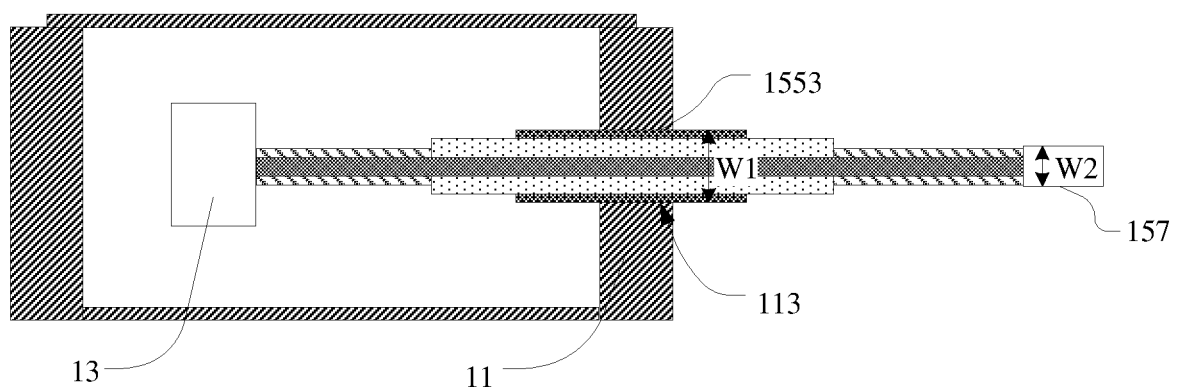
FIG. 5 is a schematic diagram of an electrical lead-out structure passing through a hermetic housing according to an implementation of this application.

The electrical lead-out structure 15 further includes an electrical connector 157. The electrical connector 157 is fastened to a second end that is of the flexible circuit board 151 and that is exposed outside the hermetic housing 11, and the electrical connector 157 is electrically connected to the electrical signal layer 1511 at the second end of the flexible circuit board 151. With reference to FIG. 5, a thickness (W2 shown in FIG. 5) of an electrical connector 157 is not greater than a maximum thickness (W1 shown in FIG. 5) of a feed-through area 1501 of an electrical lead-out structure 15, so that the electrical connector 157 can pass through a connecting hole 113. It may be understood that the thickness of the electrical connector 157 is not limited in this application. The electrical connector 157 may be electrically connected to a flexible circuit board 151 after the electrical lead-out structure 15 passes through the connecting hole 113.

Figure 6:
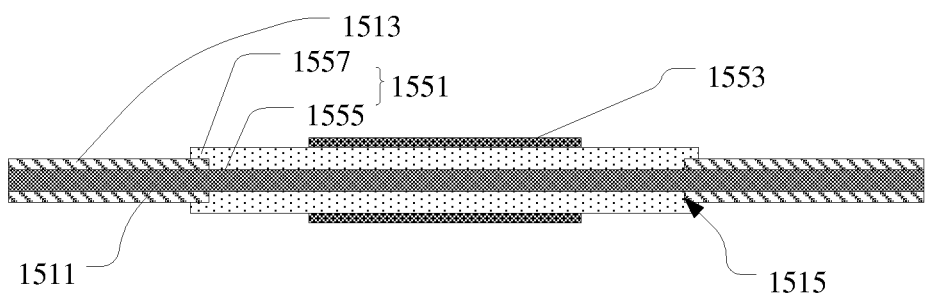
FIG. 6 and FIG. 7 are schematic diagrams of possible structures of an electrical lead-out structure in some implementations of this application.

With reference to FIG. 6, in an example implementation, a glass substrate layer 1551 includes a first connecting portion 1555 and a second connecting portion 1557 that are disposed in a connection manner. The first connecting portion 1555 is located in a window 1515 and is in contact with an electrical signal layer 1511. The second connecting portion 1557 covers a side that is of the first connecting portion 1555 and that is away from the electrical signal layer 1511, and two end portions of the second connecting portion 1557 in an extension direction of an electrical lead-out structure 15 always cover a side that is of a reinforcing layer 1513 and that is away from the electrical signal layer 1511. In other words, the second connecting portion 1557 is located outside the window 1515, and a length L1 of the second connecting portion 1557 in an extension direction of the flexible circuit board 151 is greater than a length L2 of the window 1515, to prevent the electrical signal layer 1511 from being damaged due to insufficient strength caused by suspension during soldering. In a stacking direction of the electrical signal layer 1511 and the glass substrate layer 1551, a thickness of the glass substrate layer 1551 is greater than a depth of the window 1515. The glass substrate layer 1551 has a sufficient thickness, so that the electrical signal layer 1511 is protected, and the electrical signal layer 1511 is not damaged due to a high temperature during soldering. In this implementation, the glass substrate layer 1551 is a glass layer, a melting point of the glass substrate layer 1551 is lower than a melting point of the reinforcing layer 1513, and the melting point of the reinforcing layer 1513 is lower than a melting point of the electrical signal layer 1511. It may be understood that, if the melting point of the reinforcing layer 1513 is high, the glass substrate layer 1551 may be a ceramic layer.

The following briefly describes assembly of a hermetic apparatus 10. A metal layer (not shown in the figure) is plated on a surface of a hermetic housing 11, and a material of the metal layer on the hermetic housing 11 is the same as a material of a metal layer 1553 of a packaging layer 155. The metal layer on the surface of the hermetic housing 11 is configured to improve wettability of soldering. During the assembly, an electrical lead-out structure 15 is placed in the hermetic housing 11 of the hermetic apparatus 10, and an electrical signal layer 1511 at a first end of a flexible circuit board 151 is electrically connected to a functional component 13 accommodated in the hermetic housing 11. The electrical lead-out structure 15 is partially fixed using a fixture, and the electrical lead-out structure 15 passes through a connecting hole 113 of the hermetic housing 11. A position of the packaging layer 155 corresponds to a position of the connecting hole 13, so that a second end of the flexible circuit board 151 is exposed outside the hermetic housing 11. The hermetic housing 11 is heated. In this implementation, the hermetic housing 11 is heated using a heat source. Contact heating or induction heating may be used, and a heating temperature and heating time are controlled. The heating temperature is approximately 20° C. lower than a melting point of a solder used by the electrical lead-out structure 15. The hermetic housing 11 and the packaging layer 155 are soldered together, so that a complete seam is formed between the hermetic housing 11 and the packaging layer 155, to implement a hermetic connection between the hermetic housing 11 and the electrical lead-out structure 15. When the soldering needs to be performed, the solder is added to a contact area between the hermetic housing 11 and the metal layer 1553.

Figure 7:
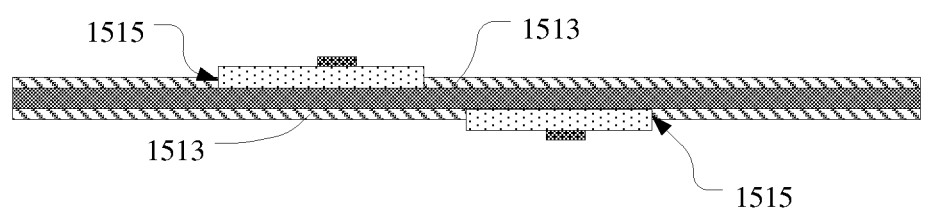

With reference to FIG. 7, in an implementation, a window 1515 of one reinforcing layer 1513 and a window 1515 of the other reinforcing layer 1513 are not disposed in alignment. Instead, a window 1515 of one reinforcing layer 1513 and a window 1515 of the other reinforcing layer 1513 may be disposed in a staggered manner, to match a special-shaped hermetic housing 11 or a special-shaped connecting hole 113.

Figure 8:
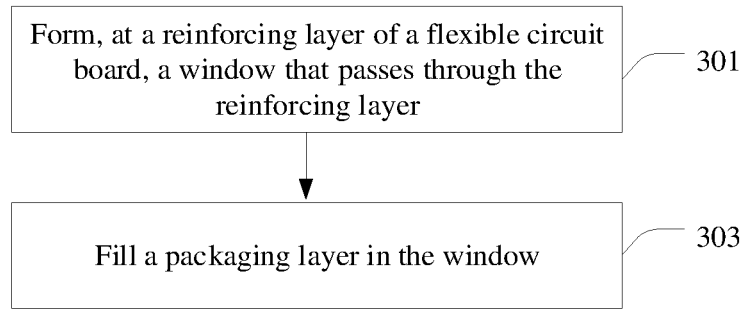
FIG. 8 is a flowchart of a method for preparing an electrical lead-out structure according to an implementation of this application.

With reference to FIG. 8, an implementation of this application further provides a method for preparing an electrical lead-out structure 15. The method includes the following steps.

Step 301: A window 1515 that passes through a reinforcing layer 1513 is formed at the reinforcing layer 1513 of a flexible circuit board 151, to expose an electrical signal layer 1511. In this implementation, the reinforcing layer 1513 is etched using a mask, to form the window. The flexible circuit board includes the electrical signal layer 1511 and the reinforcing layer 1513 covering the electrical signal layer 1511. The electrical signal layer 1511 is configured to dispose a wire. It may be understood that a structure of the electrical signal layer 1511 is not limited in this application. For example, the electrical signal layer 1511 may include a substrate, a copper foil, and an adhesive layer, where the adhesive layer adheres between the substrate and the copper foil. In this implementation, the reinforcing layer 1513 is made of polyimide (PI). The reinforcing layer 1513 is an outermost layer of the electrical lead-out structure 15. It may be understood that the reinforcing layer 1513 may be made of another insulating material that can protect the electrical signal layer 1513.

Step 303: A packaging layer 155 fills the window 1515, to form the electrical lead-out structure 10. The packaging layer 155 includes a glass substrate layer 1551 and a metal layer 1553 that are stacked up. The glass substrate layer 1551 fills the window 1515 and is insulatingly adjacent to the electrical signal layer 1511. The metal layer 1553 is disposed on a side that is of the glass substrate layer 1551 and that is away from the electrical signal layer 1551. In this implementation, the metal layer 1553 is made of a material of gold (Au), and the gold can improve wettability of a solder. It may be understood that a material of the metal layer 1553 is not limited to Au, and the metal layer 1553 may use another metal material, for example, Ag. If the metal layer 1553 is too thin, the metal layer 1553 is easily diffused during soldering, and the glass substrate layer 1553 is exposed. If the metal layer 1553 is too thick, the soldering may be affected. A thickness of the metal layer 1553 may be but is not limited to 5 to 10 micrometers.

Figure 9:
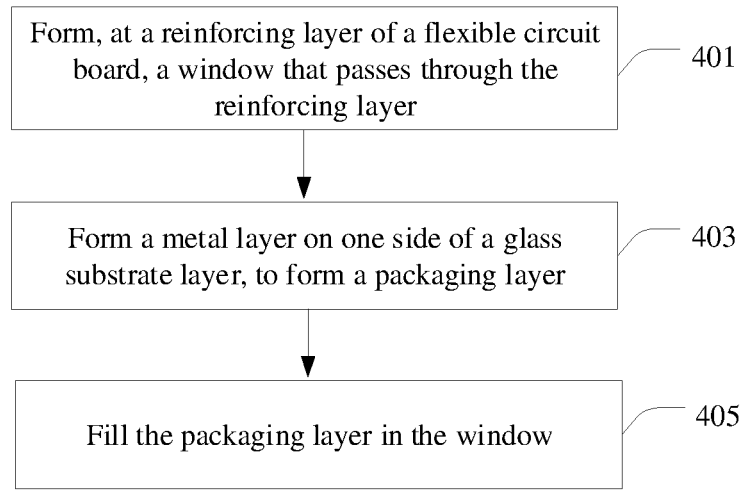
FIG. 9 is a flowchart of a method for preparing an electrical lead-out structure according to an implementation of this application.
Figure 10:
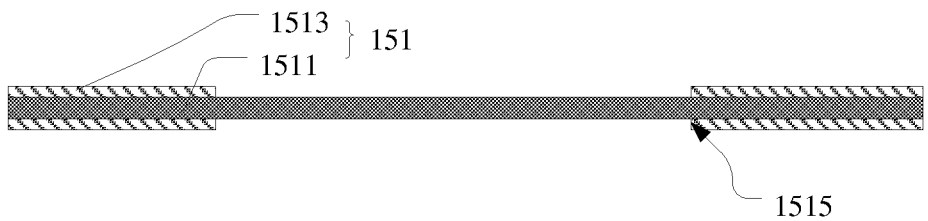
FIG. 10 is a schematic diagram of a structure obtained in step 401 shown in FIG. 9.

With reference to FIG. 9, an implementation of this application further provides a method for preparing an electrical lead-out structure 15. The method includes the following steps:

Step 401: With reference to FIG. 10, a window 1515 that passes through a reinforcing layer 1513 is formed at the reinforcing layer 1513 of a flexible circuit board 151, to expose an electrical signal layer 1511. The flexible circuit board includes the electrical signal layer 1511 and the reinforcing layer 1513 covering the electrical signal layer 1511. The electrical signal layer 1511 is configured to dispose a wire. It may be understood that a structure of the electrical signal layer 1511 is not so limited in this application. For example, the electrical signal layer 1511 may include a substrate, a copper foil, and an adhesive layer, where the adhesive layer adheres between the substrate and the copper foil. In this implementation, the reinforcing layer 1513 is made of polyimide (PI). The reinforcing layer 1513 is an outermost layer of the electrical lead-out structure 15. It may be understood that the reinforcing layer 1513 may be made of another insulating material that can protect the electrical signal layer 1513. In this implementation, the reinforcing layer 1513 is etched using a mask, to form the window.

Figure 11:
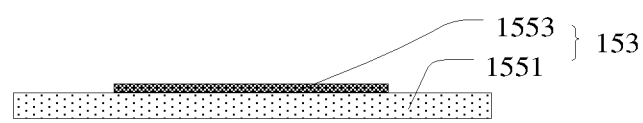
FIG. 11 is a schematic diagram of a structure obtained in step 403 shown in FIG. 9.

Step 403: With reference to FIG. 11, a metal layer 1553 is formed on one side of a glass substrate layer 1551, to form a packaging layer 155. In this implementation, a sputtering process is used to form the metal layer 1553 on one side of the glass substrate layer 1551. The metal layer 1553 is configured to improve wettability of a solder. The metal layer 1553 is made of a material of gold (Au), and the gold has a strong adhesion, so that connection strength between the glass substrate layer 1551 and the metal layer 1553 can be improved. It may be understood that a material of the metal layer 1553 is not limited to Au, and the metal layer 1553 may use another metal material, for example, Ag. If the metal layer 1553 is too thin, the metal layer 1553 is easily diffused during soldering, and the glass substrate layer 1553 is exposed. If the metal layer 1553 is too thick, the soldering may be affected. A thickness of the metal layer 1553 may be but is not limited to 5 to 10 micrometers.

Step 405: The packaging layer 155 fills the window 1515, to form the electrical lead-out structure 15. The glass substrate layer 1551 on a side that is of the packaging layer 155 and that faces the electrical signal layer 1511 is insulatingly adjacent to the electrical signal layer 1511. A side that is of the packaging layer 155 and that is away from the electrical signal layer 1511 is configured to be soldered to a metal element, for example, a hermetic housing 11, to implement a hermetic connection.

In this implementation, step 405 includes: The packaging layer 155 is aligned with the window 1515, and the packaging layer 155 is pressed into the window 1515 through hot pressing, so that the glass substrate layer 1551 of the packaging layer 155 is hermetically connected to the electrical signal layer 1511 in the window 1515 through an intermolecular bonding force. A material of a wiring layer of the electrical signal layer 1511 is a copper foil, the copper foil is resistant to 1000° C., a material of the reinforcing layer 1513 is polyimide, the polyimide is resistant to 350° C., the reinforcing layer 1513 can protect the unexposed electrical signal layer 1511, the glass substrate layer 1551 uses a low-temperature glass material with a melting point of 300° C., and the metal layer 1553 is sputtered with Au, and has a strong adhesion. Therefore, a hot pressing process temperature of 300° C. may be selected for the glass substrate layer 1551 and the electrical signal layer 1511.

According to the electrical lead-out structure 15 and the related preparation method thereof, the hermetic apparatus 10, and the optical communication device 100 provided in this application, the flexible circuit board 151 and the packaging layer 155 are integrated together, the electrical lead-out structure 15 passes through the hermetic housing 11, and the packaging layer 155 can be soldered to the hermetic housing 11 to implement hermeticity. In the electrical lead-out structure 15, it is not the case that a plurality of electrical connectors used for interconnection are disposed in the hermetic housing 11. This simplifies structures of the electrical lead-out structure 15 and the hermetic apparatus 20, and facilitates miniaturization development of the hermetic apparatus 10. For example, for a hermetic apparatus of a same model, if a length of an electrical lead-out structure is reduced from 36 mm to 12 mm, a volume of the hermetic apparatus 10 provided in this application may be reduced by approximately 15%. The flexible circuit board 151 requires no specially bent layout, to reduce space occupied by the electrical lead-out structure 15 in the hermetic apparatus 10, and facilitate arrangement of the functional components 13 in the hermetic apparatus 10.

It should be understood that expressions such as "include" and "may include" that may be used in this application indicate existence of the disclosed function, operation, or constituent element, and do not limit one or more additional functions, operations, and constituent elements. In this application, terms such as "include" and/or "have" may be construed as a particular characteristic, quantity, operation, constituent element, or component, or a combination thereof, but cannot be construed as excluding existence or possible addition of one or more other characteristics, quantities, operations, constituent elements, or components, or combinations thereof.

In addition, in this application, an expression "and/or" includes any and all combinations of words listed in association. For example, an expression "A and/or B" may include A, may include B, or may include both A and B.

In this application, expressions including ordinal numbers such as "first" and "second" may modify all elements. However, such elements are not limited by the expressions. For example, the expressions do not limit the order and/or importance of the elements. The expression is used only to distinguish one element from another. For example, first user equipment and second user equipment indicate different user equipments, although both the first user equipment and the second user equipment are user equipments. Similarly, without departing from the scope of this application, a first element may be referred to as a second element, and similarly, a second element may be referred to as a first element.

When a component "connects" or "is connected" to another component, it should be understood that the component directly connects or is directly connected to the another component, and a further component may exist between the component and the another component. In addition, when a component "directly connects" or "is directly connected" to another component, it should be understood that there is no component between them.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to and defined by the protection scope of the claims.

What is claimed is:

1. An electrical lead-out structure, used for hermetic package, wherein the electrical lead-out structure comprises:
a flexible circuit board, and
a packaging layer,
the flexible circuit board comprising a stacked electrical signal layer and a reinforcing layer,
the reinforcing layer is provided with a window that passes through the reinforcing layer, the stacked electrical signal layer is adjacent to the window, the packaging layer fills the window, and a side that is of the packaging layer and that faces the electrical signal layer is insulatingly adjacent to the electrical signal layer.

2. The electrical lead-out structure according to claim 1, wherein the packaging layer comprises a stacked glass substrate layer and a metal layer, the stacked glass substrate layer fills the window and is insulatingly adjacent to the electrical signal layer, and the metal layer is disposed on a side that is of the glass substrate layer and that is away from the electrical signal layer.

3. The electrical lead-out structure according to claim 2, wherein the glass substrate layer comprises a first connecting portion and a second connecting portion, the first connecting portion is accommodated in the window, the second connecting portion covers a side that is of the first connecting portion and that is away from the electrical signal layer, and two end portions of the second connecting portion in an extension direction of the flexible circuit board always cover a side that is of the reinforcing layer and that is away from the electrical signal layer.

4. The electrical lead-out structure according to claim 1, wherein the electrical signal layer comprises a first surface and a second surface that are disposed opposite to each other, the structure comprises a first reinforcing layer and a second reinforcing layer, one of the first and second reinforcing layers covers the first surface, the other of the first and second reinforcing layers covers the second surface, and each of the first and second reinforcing layers is provided with the window.

5. The electrical lead-out structure according to claim 4, wherein a position of each window at the first reinforcing layer corresponds to a position of one window at the second reinforcing layer, and the windows at the first and second reinforcing layers are arranged in a stacking direction of the electrical signal layer and the first and second reinforcing layers.

6. The electrical lead-out structure according to claim 1, wherein the electrical lead-out structure further comprises an electrical connector, the electrical signal layer at a first end of the flexible circuit board in a direction that extends the flexible circuit board is configured to electrically connect to a functional component, and the electrical connector is fastened to and electrically connected to a second end of the flexible circuit board in the direction that extends the flexible circuit board.

7. A hermetic apparatus comprising:
a hermetic housing,
a functional component, and
the electrical lead-out structure according to claim 1,
the hermetic housing is provided with a connecting hole that passes through a side wall of the hermetic housing, the functional component is accommodated in the hermetic housing, the electrical lead-out structure passes through the connecting hole, a side that is of a packaging layer and that is away from an electrical signal layer is soldered to the hermetic housing, the electrical signal layer at a first end of a flexible circuit board is electrically connected to the functional component, and a second end of the flexible circuit board is exposed outside the hermetic housing.

8. The hermetic apparatus according to claim 7, wherein the hermetic apparatus is a wavelength selective switch, and the functional component is configured to perform optical path conversion.

9. An optical communication device, comprising:
the hermetic apparatus according to claim 7, and
a drive board,
wherein the hermetic apparatus is a wavelength selective switch, and a second end of a flexible circuit board exposed outside a hermetic housing is electrically connected to the drive board through an electrical connector.

10. A method for preparing an electrical lead-out structure comprising:
forming, at a reinforcing layer of a flexible circuit board, a window that passes through the reinforcing layer, wherein the flexible circuit board comprises an electrical signal layer and the reinforcing layer covers the electrical signal layer; and
filling a packaging layer in the window, wherein a side that is of the packaging layer and that faces the electrical signal layer is insulatingly adjacent to the electrical signal layer.

11. The preparation method according to claim 10, further comprising before filling a packaging layer in the window:
forming a metal layer on one side of a glass substrate layer, to form the packaging layer; and
wherein the filling a packaging layer in the window comprises: enabling the electrical signal layer to be insulatingly adjacent to a side that is of the glass substrate layer and that is away from the metal layer.

12. The preparation method according to claim 11, wherein the filling a packaging layer in the window comprises: hermetically connecting the packaging layer to the electrical signal layer at the window through hot pressing.

13. An electrical lead-out structure, used for hermetic package, wherein the electrical lead-out structure comprises:
a flexible circuit board, and
a packaging layer configured to be soldered to a hermetic housing to create a hermetic connection between the electrical lead-out structure and the hermetic housing,
the flexible circuit board comprising a stacked electrical signal layer and a reinforcing layer,
the reinforcing layer is provided with a window that passes through the reinforcing layer, the electrical signal layer is adjacent to the window, the packaging layer fills the window, and a side that is of the packaging layer and that faces the electrical signal layer is provided insulatingly adjacent to the electrical signal layer,
wherein the packaging layer comprises a glass substrate layer and a metal layer that are stacked, the glass substrate layer fills the window in the reinforcing layer, and the metal layer is disposed on an area of the glass substrate layer away from the electrical signal layer.

14. The electrical lead-out structure according to claim 13, wherein the glass substrate layer comprises a first connecting portion and a second connecting portion, the first connecting portion is accommodated in the window, the second connecting portion covers an area of the first connecting portion that is away from the electrical signal layer, and two end portions of the second connecting portion in a direction that extends the flexible circuit board cover an aread of the reinforcing layer that is away from the electrical signal layer.

15. The electrical lead-out structure according to claim 13, wherein the electrical signal layer comprises a first surface and a second surface that are disposed opposite to each other, the structure comprises a first reinforcing layer and a second reinforcing layer, one of the first and second reinforcing layers covers the first surface, the other of the first and second reinforcing layers covers the second surface, and each of the first and second reinforcing layers is provided with the window.

16. The electrical lead-out structure according to claim 15, wherein a position of each window at the first reinforcing layer corresponds to a position of one window at the second reinforcing layer, and the windows at the first and second reinforcing layers are arranged in a stacking direction of the electrical signal layer and the first and second reinforcing layers.

17. The electrical lead-out structure according to claim 13, wherein the electrical lead-out structure further comprises an electrical connector, the electrical signal layer at a first end of the flexible circuit board in a direction that extends the flexible circuit board is configured to electrically connect to a functional component, and the electrical connector is fastened to and electrically connected to a second end of the flexible circuit board in the direction that extends the flexible circuit board.

* * * * *